(12) United States Patent
Mu et al.

(10) Patent No.: US 9,735,734 B2
(45) Date of Patent: Aug. 15, 2017

(54) RE-CONFIGURABLE PASSIVE MIXER FOR WIRELESS RECEIVERS

(75) Inventors: Fenghao Mu, Hjärup (SE); Fredrik Tillman, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1412 days.

(21) Appl. No.: 12/243,232

(22) Filed: Oct. 1, 2008

(65) Prior Publication Data

US 2010/0081408 A1    Apr. 1, 2010

(51) Int. Cl.
| | | |
|---|---|---|
| H04B 1/26 | (2006.01) | |
| H03D 7/14 | (2006.01) | |
| H03D 7/16 | (2006.01) | |

(52) U.S. Cl.
CPC ......... *H03D 7/1441* (2013.01); *H03D 7/1458* (2013.01); *H03D 7/1466* (2013.01); *H03D 7/165* (2013.01); *H03D 2200/0023* (2013.01); *H03D 2200/0043* (2013.01); *H03D 2200/0084* (2013.01); *H03D 2200/0088* (2013.01)

(58) Field of Classification Search
CPC ....... H03D 7/14; H03D 7/1466; H03D 7/1491
USPC ............... 455/189.1, 208, 209, 326
See application file for complete search history.

(56) References Cited

U.S. PATENT DOCUMENTS

| | | | |
|---|---|---|---|
| 4,027,251 A * | 5/1977 | Fathauer et al. ........... 455/165.1 | |
| 6,801,761 B2 | 10/2004 | Khorram | |
| 6,847,808 B2 | 1/2005 | Zhou | |
| 6,970,689 B2 | 11/2005 | Khorram | |
| 7,020,675 B2 | 3/2006 | Comer et al. | |
| 7,102,411 B2 | 9/2006 | Behzad | |
| 7,130,607 B2 | 10/2006 | Khorram | |
| 7,323,945 B2 | 1/2008 | Cyr et al. | |
| 2003/0157918 A1 | 8/2003 | Gamliel | |
| 2005/0239430 A1 | 10/2005 | Shah | |
| 2006/0205370 A1* | 9/2006 | Hayashi et al. ............. 455/209 |
| 2007/0085719 A1* | 4/2007 | Maxim et al. ................ 341/144 |
| 2007/0087711 A1* | 4/2007 | Pan ........................... 455/127.4 |
| 2007/0247212 A1 | 10/2007 | Zhang | |
| 2007/0287404 A1 | 12/2007 | Arnborg | |
| 2008/0003973 A1* | 1/2008 | Vaisanen ...................... 455/326 |
| 2009/0239592 A1* | 9/2009 | Deng et al. .................. 455/574 |
| 2010/0041359 A1* | 2/2010 | Liu et al. ..................... 455/311 |

OTHER PUBLICATIONS

Rodriguez, S. et al, "Digital calibration of gain and linearity in a CMOS RF mixer," IEEE International Symposium on Circuits and Systems (ISCAS), May 18-21, 2008, pp. 1288-1291.

* cited by examiner

*Primary Examiner* — Yuwen Pan
*Assistant Examiner* — Fatuma Sherif
(74) *Attorney, Agent, or Firm* — Coats & Bennett, PLLC

(57) ABSTRACT

A configurable passive mixer is described herein. According to one exemplary embodiment, the passive mixer comprises a clock generator, a controller, and a plurality of passive mixer cores connected in parallel. The clock generator comprises a local oscillator drive unit for each passive mixer core. The controller varies an effective transistor size of the passive mixer by separately configuring each of the passive mixer cores to enable/disable each passive mixer core. For example, the controller may selectively enable one or more of the passive mixer cores to vary the effective transistor width of the passive mixer. As the performance requirements and/or the operating communication standard change, the controller may re-configure each passive mixer core.

20 Claims, 9 Drawing Sheets

RE-CONFIGURABLE PASSIVE MIXER FOR WIRELESS RECEIVERS

TECHNICAL FIELD

The present invention generally relates to all wireless receivers, and particularly to frequency down conversion of radio frequency signals in wireless receivers.

BACKGROUND

Wireless applications rely on Radio Frequency (RF) signals to communicate information in a wireless network. A transmitter forms RF signals for transmission by modulating a baseband frequency signal (information) onto an RF carrier frequency signal. A receiver downconverts the received RF signal to the baseband frequency before baseband signal processing occurs. RF signals may be directly down converted to baseband by a zero intermediate frequency (ZIF) down converter or may be processed by one or more intermediate frequency (IF) stages before finally being converted to baseband.

The down conversion mixer may be passive or active. A passive mixer typically provides a conversion gain less than 0 dB, while an active mixer typically provides a conversion gain greater than 0 dB when down converting the received RF signal to a baseband frequency signal. Active mixers also consume more power, cause higher distortion, and have a higher noise figure than their passive mixer counterparts. The higher noise figure arises from flicker noise, which is not present in passive mixers. Flicker noise is particularly harmful for narrow band RF applications, e.g., GSM (Global System for Mobile communications).

While passive mixers provide improved linearity, noise performance, and power consumption, passive mixers tend to provide a fixed solution for all receiver configurations. For example, a passive mixer may be designed to provide a fixed conversion gain for a worst case receiver configuration. Such a fixed conversion gain results in a fixed linearity performance and unnecessarily higher power consumption for all receiver configurations. Thus, there remains a need for improved down conversion mixers.

SUMMARY

The present invention provides a configurable passive mixer for a wireless receiver. The passive mixer core described herein meets requirements associated with different communication standards, e.g., TDD (Time Division Duplex) standards, FDD (Frequency Division Duplex) standards, etc., while minimizing power consumption. According to one exemplary embodiment, the passive mixer comprises a clock generator, a controller, and a plurality of passive mixer cores connected in parallel. The clock generator comprises a local oscillator drive unit for each passive mixer core. The controller varies an effective transistor size of the passive mixer by separately configuring each of the passive mixer cores. For example, the controller may selectively enable one or more of the passive mixer cores to vary an effective transistor width of the passive mixer. As the mixer performance requirements change, e.g., responsive to a new operating communication standard, the controller may re-configure the passive mixer cores to vary the effective transistor size of the passive mixer to meet the new performance requirements.

DETAILED DESCRIPTION

Figure 1:
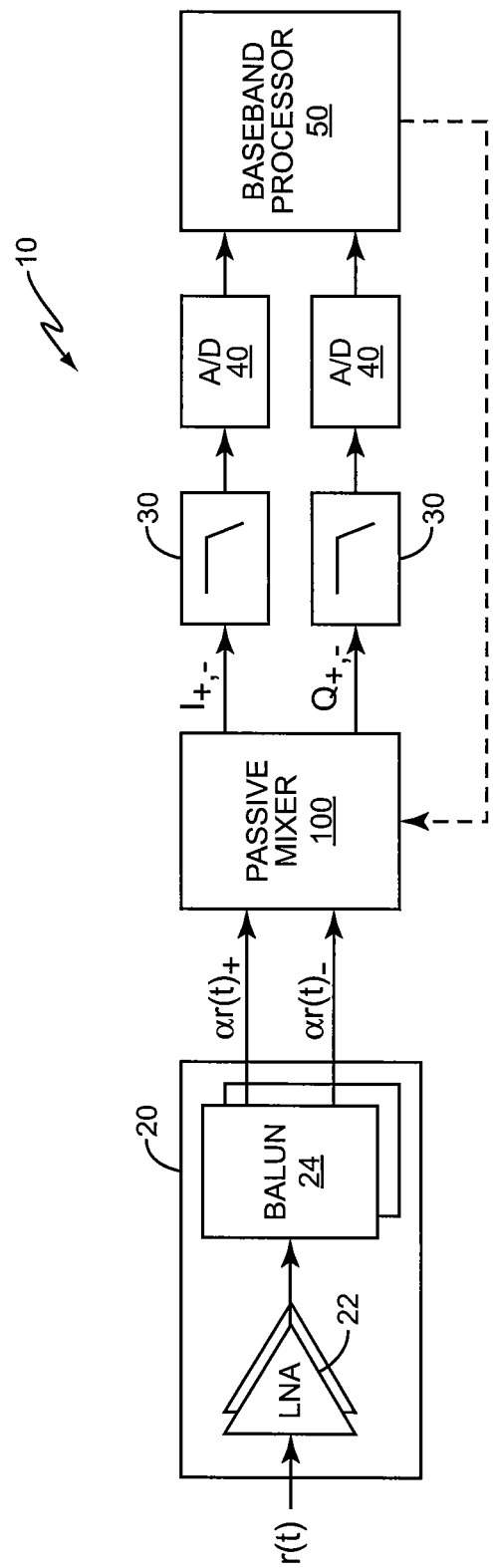
FIG. 1 shows a block diagram of a wireless receiver according to one exemplary embodiment.

FIG. 1 shows a block diagram of an exemplary wireless receiver 10 with a passive down conversion mixer 100. The receiver may be used in any wireless device, e.g., a mobile phone, radio, cordless telephone, personal digital assistant, wireless Local Area Network (WLAN) adapter such as a wireless network interface controller, etc. The following describes receiver 10 as a direct down conversion (ZIF) receiver having a mixer 100 with a single mixer stage as described herein for down converting the RF signal r(t) to differential quadrature signals $I_{+,-}$, $Q_{+,-}$ at a baseband frequency. Mixer 100 may alternatively comprise multiple mixer stages, where each stage is as described herein, and where each stage down converts the input signal to a lower frequency.

Wireless receiver 10 comprises low noise amplifier unit 20, filters 30, analog-to-digital converters 40, baseband processor 50, and passive mixer 100. Receiver 10 receives and processes an RF signal r(t) transmitted by a remote transmitter. Low noise amplifier unit 20 amplifies the received signal r(t) to generate an amplified differential output signal ($\alpha r(t)_+$ and $\alpha r(t)_-$), where $\alpha$ represents the total amplification provided by the low noise amplifier unit 20. In some embodiments, low noise amplifier unit 20 comprises one or more differential low-noise amplifiers (LNA), each with a programmable gain (not shown). In another embodiment, low noise amplifier unit 20 comprises one or more single-ended LNAs 22 connected to a balun 24. For this embodiment, the gain $\alpha$ may be provided solely by the LNA 22 or by a combination of the LNA 22 and balun 24, e.g., as described by application Ser. No. 11/609,399 titled "Method and Apparatus for Receiving Radio Frequency Signals." In either case, each LNA 22 is tuned to a different radio frequency to enable the receiver 10 to receive different RF signals. Only one LNA 22 is enabled at a time. While not explicitly shown in FIG. 1, it will be appreciated that receiver 10 may include additional amplifiers. For example, an RF amplifier may be included for each signal path between the balun 24 and the passive mixer 100 to provide additional gain or driving ability for the passive mixer 100.

Passive mixer 100 frequency down converts the differential input signal $\alpha r(t)_+$, $\alpha r(t)_-$ to differential quadrature signals (a differential In-phase channel signal $I_{+,-}$ and a differential Quadrature channel signal $Q_{+,-}$). Filters 30 filter $I_{+,-}$ and $Q_{+,-}$ to attenuate out-of-band signals. The filters 30 may comprise low pass filters or band pass filters, depending on the frequency band (e.g., ZIF, IF, etc.) of the signal output by the mixer 100. In some embodiments, the filters 30 may also amplify in-band signals with a fixed or variable gain to achieve the desired in-band signal level. Analog-to-digital converters 40 digitize the filtered signals, and baseband processor 50 processes the digitized data according to any known means. The baseband processor 50 may, e.g., perform demodulation, decoding, symbol estimation, interference cancellation, bit synchronization, error correction, etc.

Wireless receivers are typically designed to satisfy multiple performance requirements of a operating communication standard. For example, the receiver may be designed to sufficiently mitigate non-linearities caused by transceivers comprising a high-power transmitter that injects interference into the receiver, such as in a FDD mode. The second order inter-modulation product (IM2), which is measured and quantified using the second order input intercept point (IIP2), causes one harmful non-linear distortion to the desired signals. IIP2 performance may be improved by using differential RF signals and a symmetric mixer topology. The third order inter-modulation product (IM3), which is measured and quantified using the third order input intercept point (IIP3), causes another harmful non-linear distortion. IIP2 and IIP3 may be improved through the use of a balanced complementary passive mixer.

Power consumption represents another important performance requirement. As transistors continue to shrink in size, power consumption associated with these transistors decreases, and speed and functionality for the digital circuits using these transistors increases. However, when considering analog and RF design, transistor matching is critical, as it is with analog mixers, it is difficult to achieve the desired circuit symmetry without using large, power hungry transistors. Further, the required IIP2 performance for a mixer is normally defined at the maximum conversion gain required for the receiver front end (low noise amplifier unit 20, mixer 100, and filters 30) to help achieve the desired receiver front end performance. For weak RF signals, such a maximum conversion gain may be large, which results in high power consumption.

To convert RF signals into baseband or lower frequency signals, a down conversion mixer may comprise an active mixer or a passive mixer. Active mixers typically provide positive gain (>0 dB) while down converting the RF signal, and therefore, may be used to reduce the amplification requirements of low noise amplifier 20 and/or filters 30. However, active mixers also have higher distortion, a higher noise figure due to flicker noise, and higher power consumption than passive mixers. Passive mixers typically provide a conversion gain less than 0 dB while down converting the RF signal. Typically, passive mixers, e.g., balanced complementary passive mixers, have lower power consumption, lower flicker noise, and better linearity. However, to achieve the desired performance associated with multiple different communication standards, such passive mixers are typically designed to satisfy the worst-case performance requirements of the collective communication standards. Thus, the conventional passive mixer solution typically has a fixed conversion gain and linearity, which leads to a fixed power consumption that is unnecessarily high for most receiver scenarios.

Figure 2:
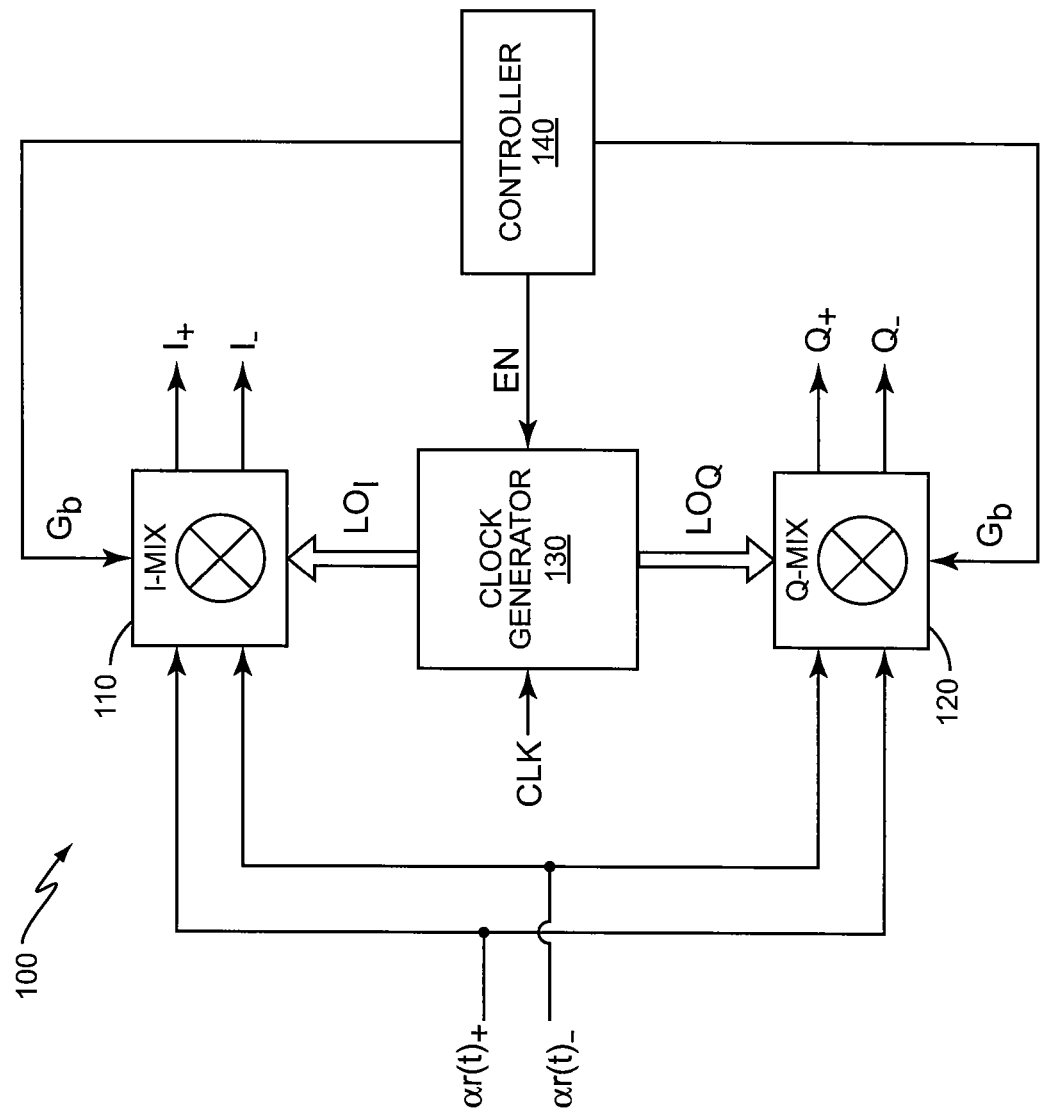
FIG. 2 shows a block diagram of a passive mixer for a wireless receiver according to one exemplary embodiment.

The present invention minimizes the power consumption by providing a passive mixer 100 having a variable effective transistor size, e.g., a variable effective transistor width. FIG. 2 shows an exemplary passive mixer 100 comprising a passive I-channel mixer 110, a passive Q-channel mixer 120, a clock generator 130, and a controller 140. I-channel mixer 110 down converts the differential input RF signal $\alpha r(t)_+$, $\alpha r(t)_-$ to a differential In-phase signal $I_+$, $I_-$ at a lower frequency, e.g., baseband frequency. Q-channel mixer 120 down converts the differential input RF signal $\alpha r(t)_+$, $\alpha r(t)_-$ to differential Quadrature signal $Q_+$, $Q_-$ at the lower frequency. Clock generator 130 generates the RF local oscillator signals ($LO_I$ and $LO_Q$) that drive the I-channel and Q-channel mixers 110, 120. Controller 140 controls the enable signals (EN) and transistor bias control signals ($G_b$) to vary the effective transistor size of the mixer 100, as described further herein.

Figure 3:
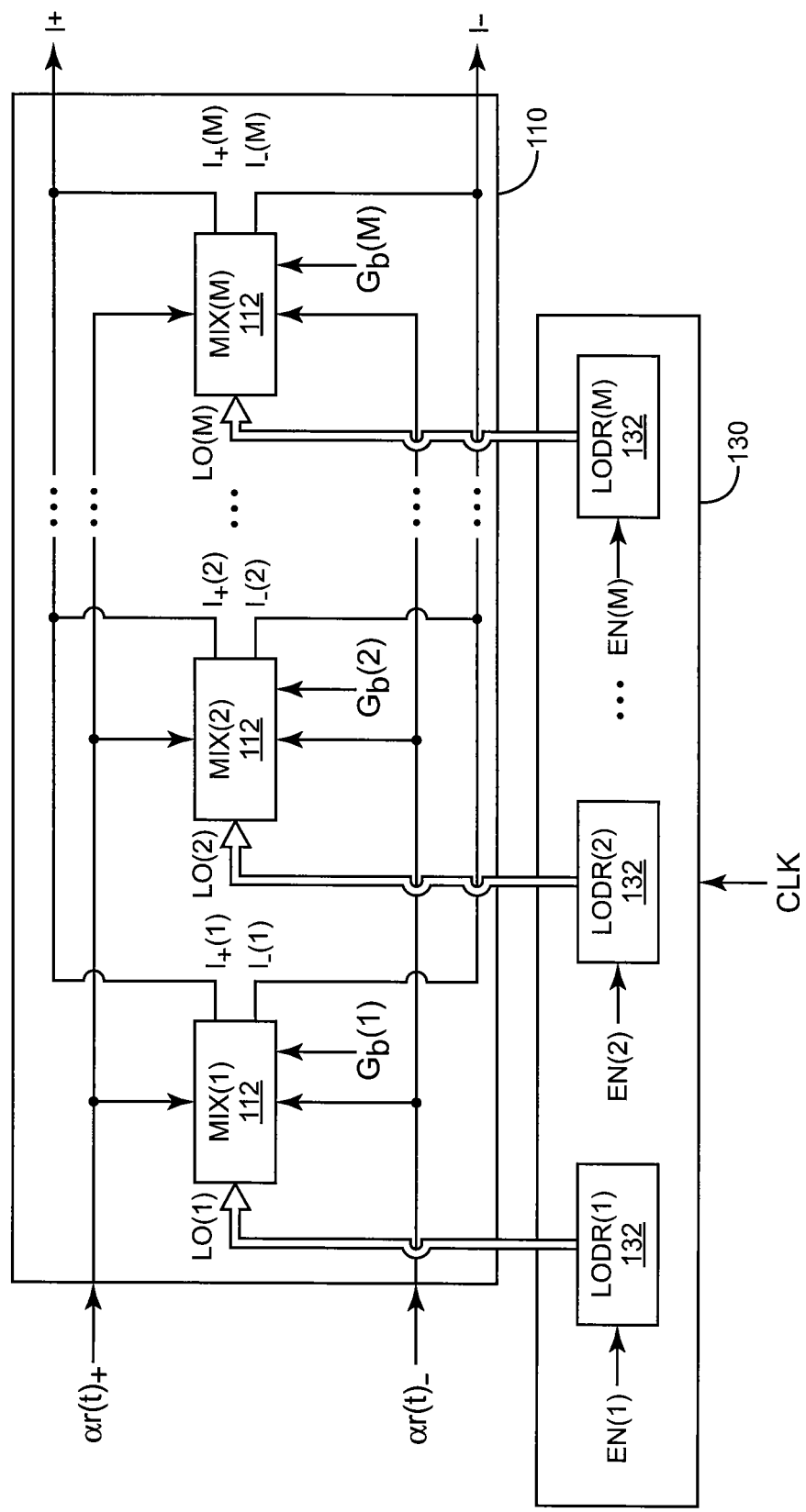
FIG. 3 shows addition details of the passive mixer of FIG. 2.

FIG. 3 shows details of the passive I-channel mixer 110 and the portion of the clock generator 130 providing the local oscillator signals $LO_I$ for the I-channel mixer 110. The passive I-channel mixer 110 and the passive Q-channel mixer 120 have equivalent configurations and operating parameters. Thus, the following describes the details of the passive I-channel mixer 110 and corresponding clock generator 130, and omits the details of the Q-channel mixer 120 and corresponding clock generator 130 for simplicity. It will be appreciated that the description of I-channel mixer 110 also applies to Q-channel mixer 120.

I-channel mixer 110 comprises M weighted passive mixer cores 112 connected in parallel with input nodes coupled to the differential RF input signal $\alpha r(t)_+$, $\alpha r(t)_-$. The differential signal outputs of each mixer core 112 ($I_+(m)$, $I_-(m)$ for m=1,2, . . . M) are tied together to provide the down converted differential output signal $I_+$, $I_-$. Clock generator 130 comprises M local oscillator drive units 132, each providing the local oscillator signals $LO_I(m)$ for a different passive mixer core 112. Controller 140 controls the enable signals EN(m) and bias control signals $G_b(m)$ of each local oscillator drive unit 132 and each mixer core 112, respectively, to vary the effective transistor size of the mixer 100 so that the mixer 100 along with the low noise amplifier unit 20 may satisfy the performance requirements of different operating communication standards, e.g., FDD, TDD, etc., and avoid unnecessary power consumption.

Figure 4:
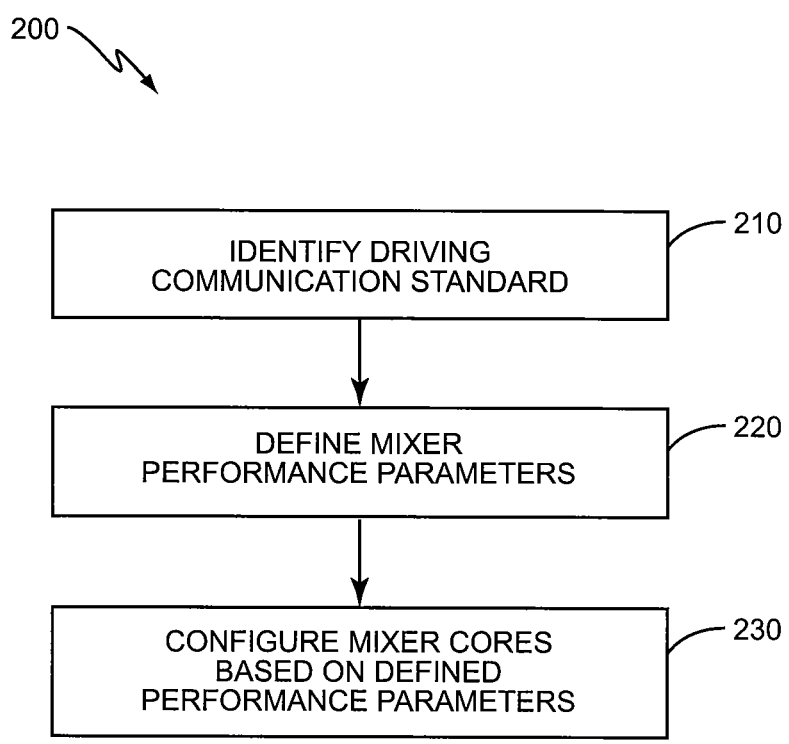
FIG. 4 shows one exemplary configuration process for the passive mixer of FIG. 2.

FIG. 4 shows one exemplary method 200 for varying the effective transistor size of the passive mixer 100 of the present invention. It will be appreciated that the present invention is not limited to the illustrated method. Controller 140 identifies the operating communication standard (block 210) using any known means. For example, the controller 140 may receive a control signal from the baseband processor 50 identifying the communication standard or may determine the communication standard directly from the received signal. Subsequently, the controller 140 defines the desired performance requirements for the receiver 10, e.g., linearity, gain, power consumption, etc. (block 220). Controller 140 then defines the performance parameters of the mixer 100 necessary to satisfy the receiver performance requirements, and varies the effective transistor size of the passive mixer by configuring the passive mixer cores 112 based on the defined mixer performance parameters (block 230). If the receiver requirements and/or the operating communication standard change, the controller 140 repeats the process 200.

The mixer cores 112 comprise weighted mixer cores 112, where the mixer core weight corresponds to the size of the transistors used to build the mixer cores 112. In some embodiments, different mixer cores 112 have the same weight. In other embodiments, different mixer cores 112 have different weights. For example, the mixer cores 112 (Mix(1), Mix(2), . . . Mix(M)) may comprise binary weighted cores such that the size of the transistors in Mix(m) is twice the size of those in Mix(m+1) for m=1,2, . . . M. In another embodiment, the mixer cores 112 may have any linear and/or non-linear weights. For example, all Mix(m) for m=1,2, . . . M may have the same weights. In general, a ratio of the size of the transistors in Mix(m) to the size of the transistors in Mix(m+1) may be set arbitrarily. While the transistor size generally includes both the length and width of the transistor, the transistor length is generally fixed to maximize speed and minimize power consumption. Thus, mixer cores 112 with different weights generally have different transistor widths.

When connected in parallel, the effective transistor size of the I-channel mixer 110 is the total combined size of the transistors in all enabled mixer cores 112. Thus, the effective transistor size of the I-channel mixer 110 depends on the size of the transistors in each mixer core 112 and the total number of enabled mixer cores 112 connected in parallel. As the effective transistor size changes, the mixer performance also changes. Thus, controller 140 may configure mixer 100 by varying the effective transistor size of the I-channel mixer 110 and the Q-channel mixer 120. For example, the width of one transistor may be represented by $W \pm \Delta w$. The effective transistor width of n equal width transistors connected in parallel may be represented by $nW \pm \sqrt{n}\Delta w$. Thus, as the number of equal width transistors increases, the effective transistor width increases and the relative mismatch decreases, which provides better linearity and better conversion gain.

In one embodiment, controller 140 varies the effective transistor width of the passive I-channel mixer 110 by selectively enabling a subset of the M mixer cores 112 and disabling the remaining mixer cores 112. As the number of enabled mixer cores 112 increases, the linearity, conversion gain, and power consumption of the mixer 100 also increases. Thus, in applications requiring higher linearity and/or higher conversion gain, e.g., FDD applications, controller 140 may enable more mixer cores 112 at the expense of a higher power consumption. In applications allowing lower linearity and/or lower conversion gain, e.g., TDD applications, controller 140 may enable fewer mixer cores 112 to reduce the power consumption. Further, when receiver 10 is in a standby mode, the linearity requirements for both FDD and TDD are relaxed. Thus, fewer mixer cores 112 may be enabled for a wake-up mode at low frequency, which leads to power savings in the standby mode.

Controller 140 may selectively enable one or more of the mixer cores 112 by controlling the enable signal EN(m) of each local oscillator drive unit 132, and by controlling the gate bias $G_b(m)$ of the transistors in each mixer core 112. For example, when $G_b(m)$ is set appropriately, e.g., low for NMOS transistors and high for PMOS transistors, and when EN(m) disables LODR(m) 132 to stop the generation of the local oscillator signals, Mix(m) 112 is disabled and does not conduct any current. When Mix(m) 112 is disabled, it will consume little to no power, even though the input nodes are still coupled to the differential RF input signal and the output nodes are still coupled to the mixer output. As a result, only the enabled mixer cores 112 contribute to the effective transistor size, and therefore, to the performance (linearity, conversion gain, power consumption, etc.) of the mixer 100.

Figure 8:
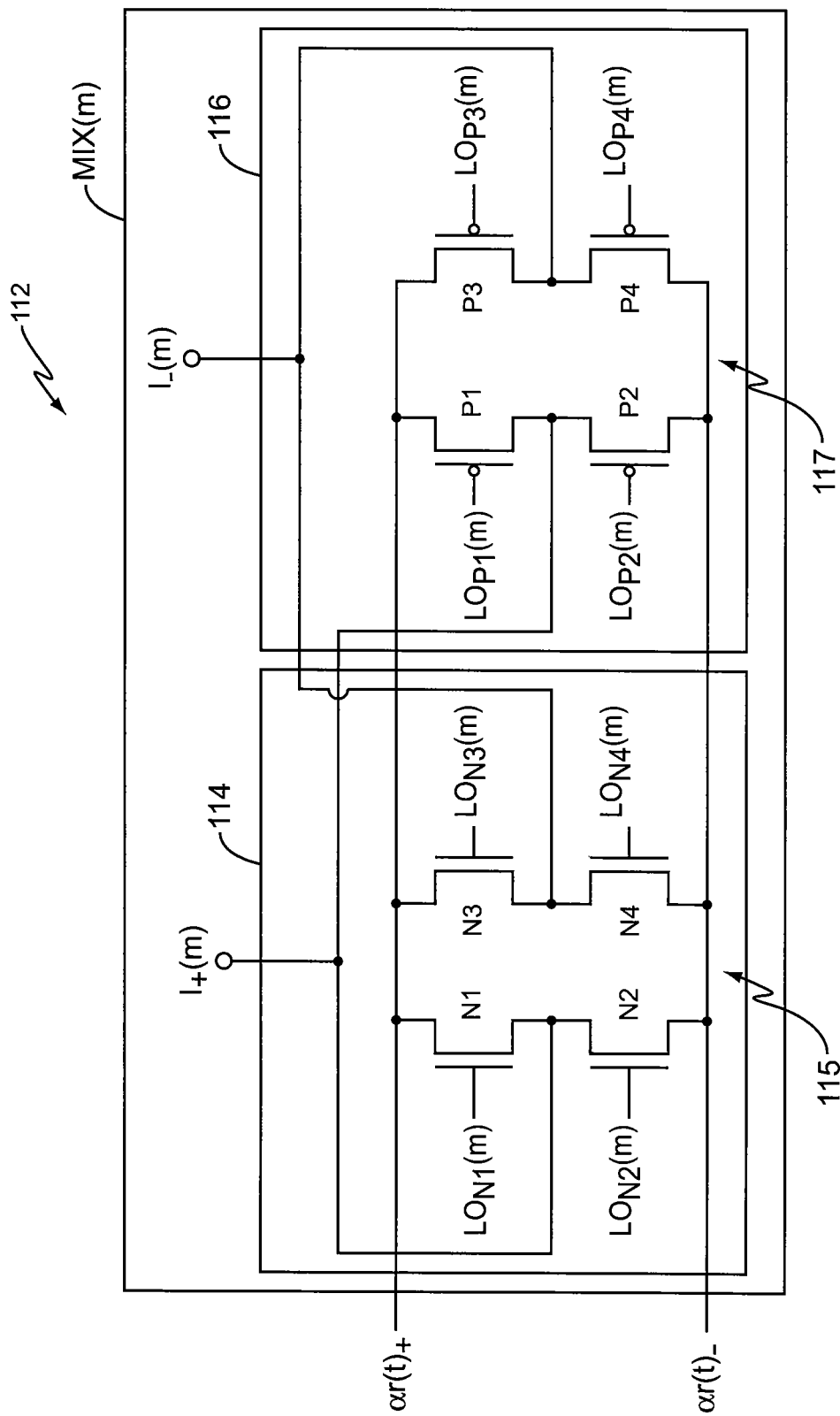
FIG. 8 shows one secondary mixer core for the exemplary passive mixer of FIG. 3.

Alternatively or additionally, controller 140 may vary the effective transistor width of the passive I-channel mixer 110 by making fine adjustments to the operating parameters of one or more mixer cores 112. For example, when the mixer cores 112 comprise NMOS and PMOS transistors connected in parallel, the controller 140 may vary the total equivalent width by using different equivalent widths for the NMOS and PMOS transistors to change the balance ratio between the NMOS and PMOS transistors for one or more mixer cores 112. This solution may significantly reduce IM3. Alternatively, when the configurable mixer 100 has at least one primary mixer core 112 (e.g., FIG. 5) and one or more secondary mixer cores 112 with narrow binary weighted transistor widths (e.g., FIG. 8), the controller 140 may configure the primary and secondary mixer cores 112 separately, as well as the corresponding local oscillator drive unit 132, so that the equivalent transistor widths for both the I-channel and Q-channel mixers 110, 120 are the same. As shown in FIG. 8, each transistor in the secondary mixer core 112 has a separate driver and bias control. This width calibration may be used during production of the mixers 100 to obtain a desired yield, or for self-calibration during an initialization period. In this way, the width deviation of the equivalent transistor widths will be compensated for, and controller 140 may reduce the imbalance between the I and Q channels to improve the IIP2.

Figure 5:
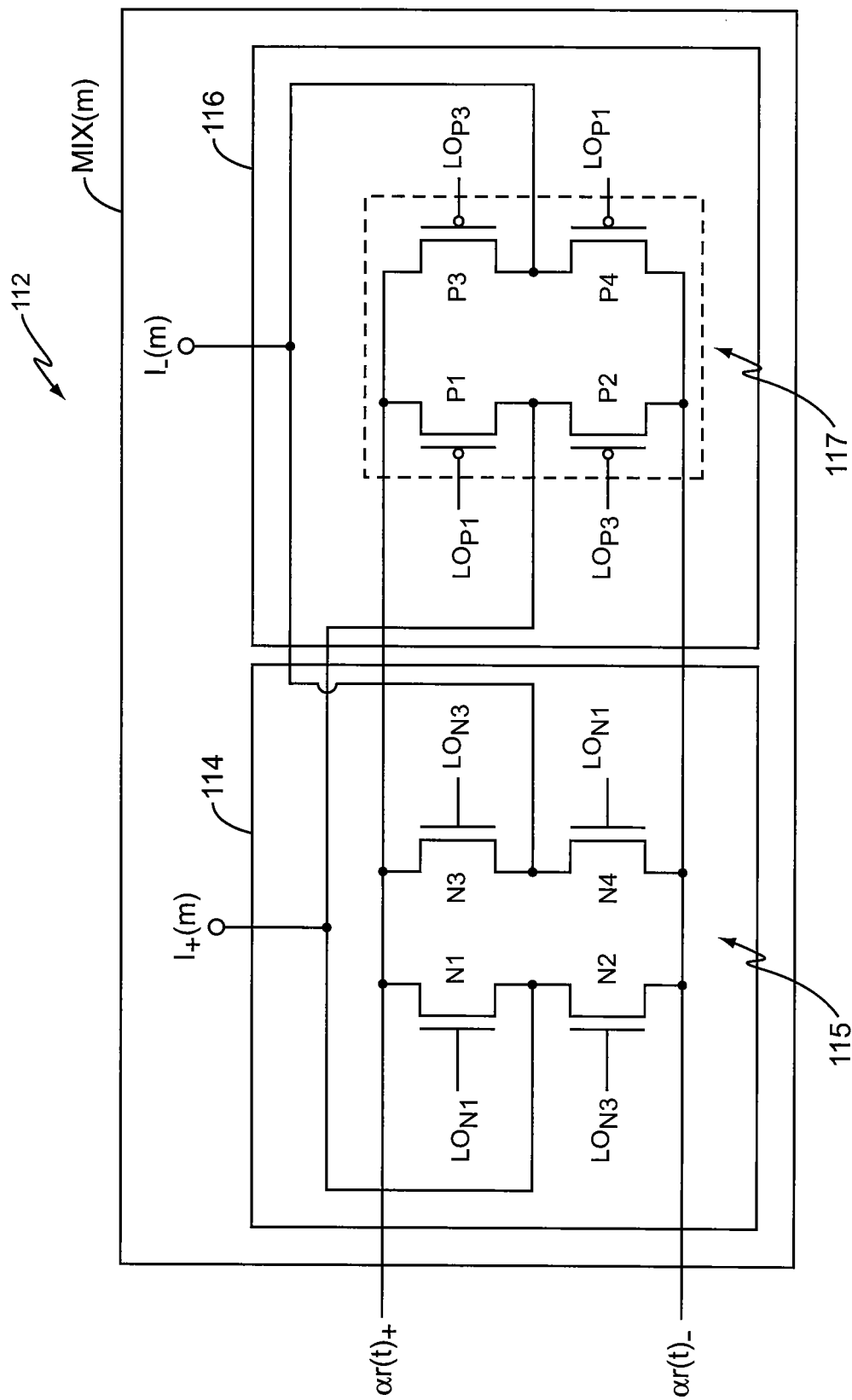
FIG. 5 shows one primary mixer core for the exemplary passive mixer of FIG. 3.

The mixer cores 112 may comprise NMOS and/or PMOS transistors connected in parallel. FIG. 5 shows one exemplary mixer core 112 for the passive mixer 100. The illustrated mixer core 112 comprises a complementary mixer core 112 for the I-channel mixer 110 comprising an N-mixer 114 of NMOS transistors 115 connected in parallel to a P-mixer 116 of PMOS transistors 117. The N-mixer 114 and P-mixer 116 comprise two sets of cascaded NMOS transistors 115 and two sets of cascaded PMOS transistors, respectively. The cascaded sets of NMOS and PMOS transistors 115, 117 in each mixer core 112 share two common input nodes. One common input node couples to the positive RF signal $\alpha r(t)_+$, and the other common input node couples to the negative RF signal $\alpha r(t)_-$. When properly balanced, the transistors 115, 117 of the complementary mixer core 112 minimize non-linearities associated with the mixer 100. Further, when the NMOS and PMOS transistors 115, 117 of both the I-channel and Q-channel mixers 110, 120 are properly sized and biased, the non-linearities introduced by the mixer 100 may mitigate the nonlinearities of the LNA 22.

To enable the $m^{th}$ mixer core 112, the controller 140 controls EN(m) to provide an active local oscillator signal LO(m) and bias control signal $G_b(m)$ for one or more transistors in the mixer core 112. During operation, the transistors 115, 117 in the mixer cores 112 operate as switches, their operation being controlled by the local oscillation signals provided by the local oscillator drive units 132. The local oscillator drive unit 132 clocks the corresponding cascaded NMOS transistors 115 with positive local oscillator signals, e.g., $LO_{N1}$, $LO_{N3}$, and clocks the corresponding cascaded PMOS transistors 117 with negative local oscillator signals, e.g., $LO_{P1}$, $LO_{P3}$. The driving strength of the local oscillator drive units 132 is proportional to the transistor width of the corresponding mixer core 112. The clock generator 130 provides the positive and negative local oscillator signals. It will be appreciated that the Q-channel mixer 120 has the same configuration, where the local oscillator signals generated for the Q-channel mixer 120 are out of phase by one-quarter of the local oscillator clock period from the local oscillator signals generated for the I-channel mixer 110.

Figure 6:
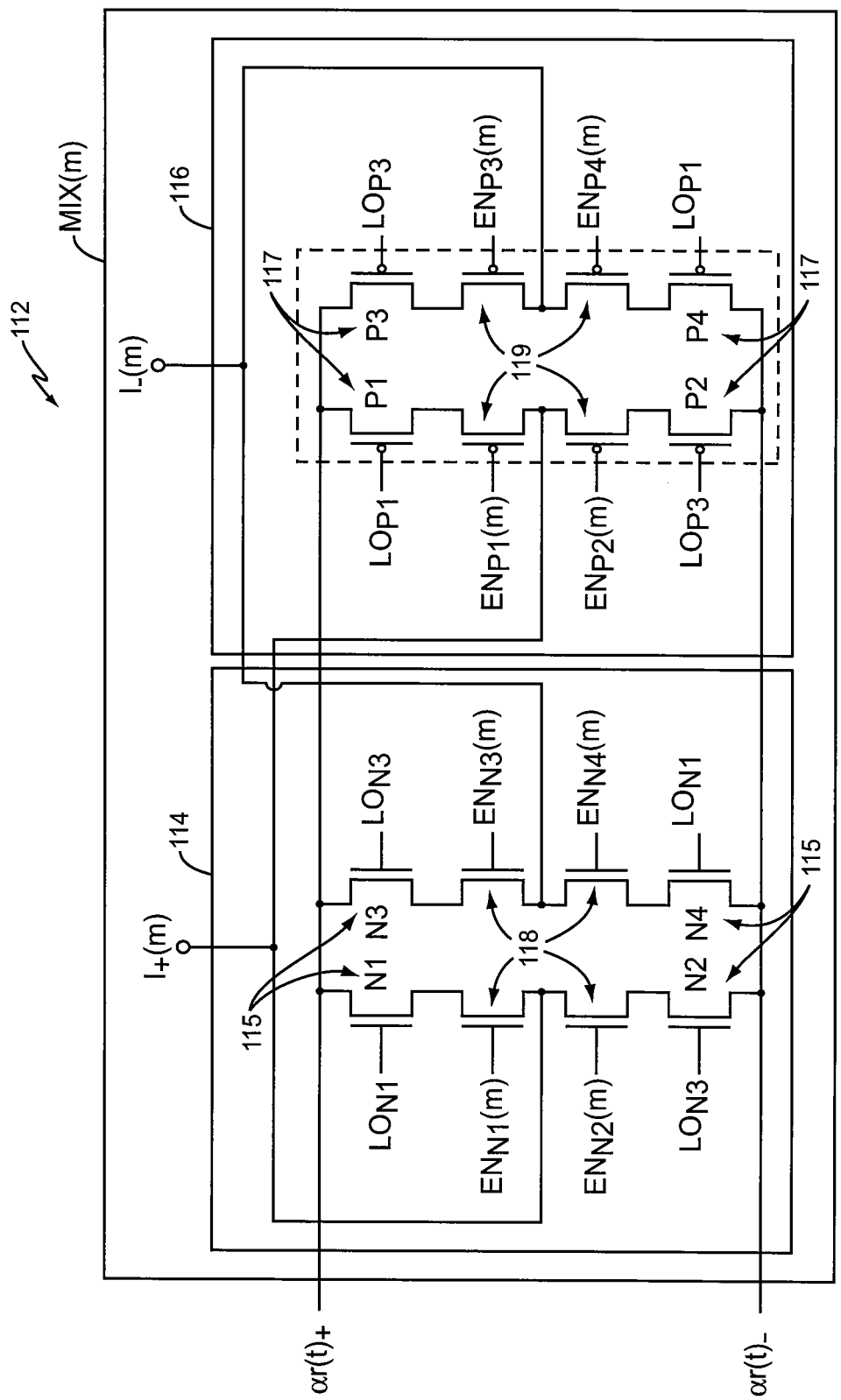
FIG. 6 shows another primary mixer core for the exemplary passive mixer of FIG. 3.

FIG. 6 shows an alternate mixer core 112 comprising additional transistors 118, 119 in series with the mixer core transistors 115, 117. These additional transistors 118, 119 serve as enabling transistors that enable/disable the mixer core transistors 115, 117 based on the input drive signals $EN_{Ni}$, $EN_{Pi}$. To enable one or more of the N-mixer core transistors 115, controller 140 enables the corresponding enable signals $EN_{Ni}$, which activates transistors 118 and connects the N-mixer transistors 115 to the output. Similarly, to enable one or more of the P-mixer core transistors 117, controller 140 enables the corresponding enable signals $EN_{Pi}$, which activates transistors 119 and connects the P-mixer transistors 117 to the output.

Figure 7:
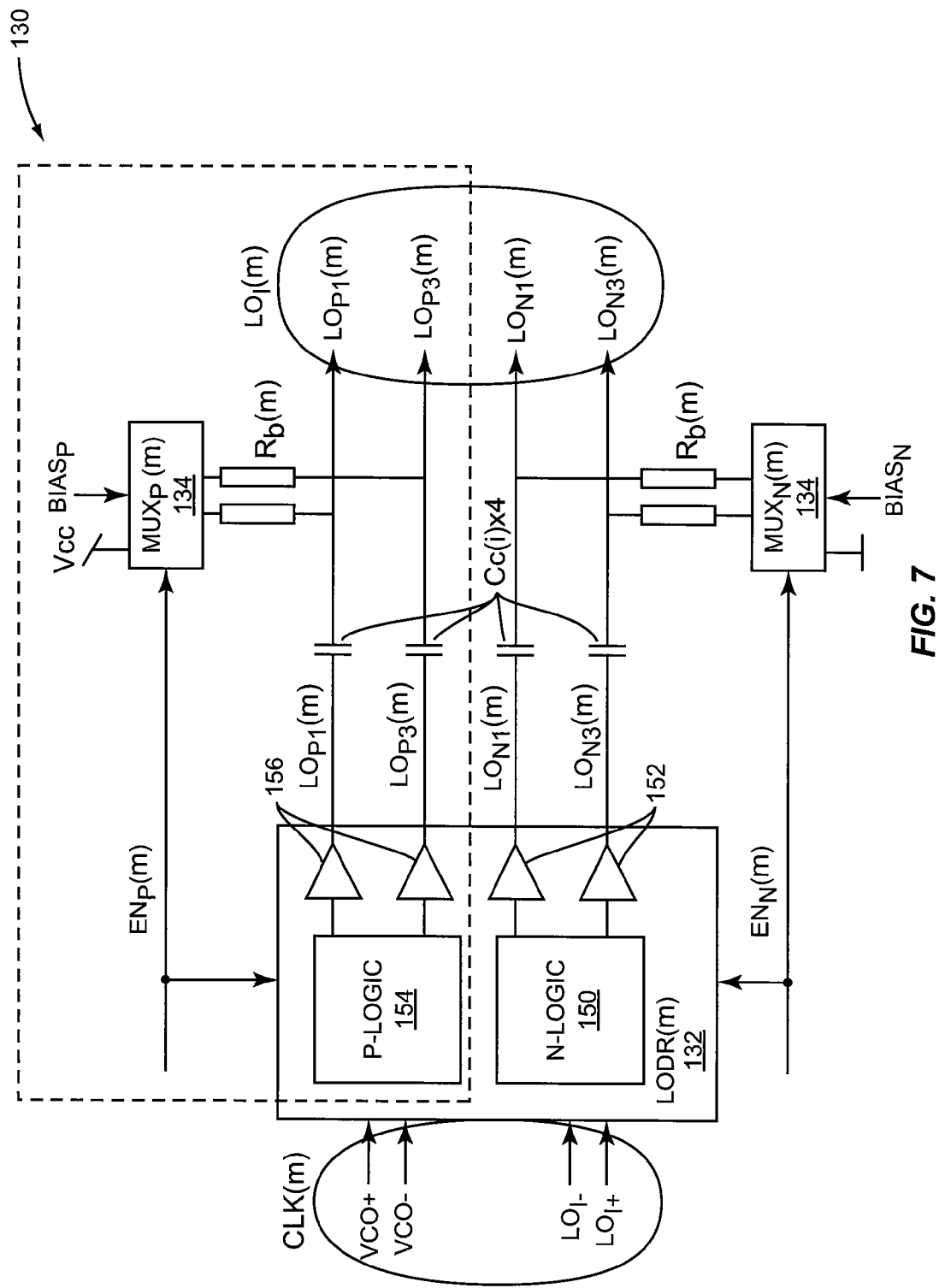
FIG. 7 shows an exemplary clock generator for the passive mixer of FIG. 2.

FIG. 7 shows exemplary elements of the clock generator 130 for the $m^{th}$ I-channel mixer core 112. For each mixer core 112, the clock generator 130 comprises a local oscillator drive unit 132 and multiplexers 134. The local oscillator drive unit 132 comprises N-logic unit 150, N-mixer clock driver 152, P-logic unit 154, and P-mixer clock driver 156. N-mixer enable signal $EN_N(m)$, P-mixer enable signal $EN_P(m)$, and clock signal CLK(m), which comprises signals $LO_{I-}$, $LO_{I+}$ and a differential voltage-controlled oscillator signal $VCO_+$, $VCO_-$, are input to the local oscillator drive unit 132. From the input clock signal CLK(m), the local oscillator drive unit 132 generates local oscillator signals with four phases that are AC coupled and DC biased at the transistor gates of the corresponding mixer core 112. Two local oscillator signals ($LO_{N1}$ and $LO_{N3}$) and their complements ($LO_{P1}$ and $LO_{P3}$) have first and third phases that control the transistor gates of the mixer core 112 for the I-channel mixer 110. It will be appreciated that the present invention also applies to two-phase or other multi-phase clock signals.

In one embodiment, the N-logic unit 150 and P-logic unit 154 of the local oscillator drive unit 132 execute logic operations to create the four-phase clock signals. For example, $LO_{N1}(m)$ may be created by the logic operation $AND(AND(LO_{I+}, EN_N(m)), VCO_-)$, and $LO_{N3}(m)$ using the operation $AND(AND(LO_{I-}, EN_N(m)), VCO_-)$, in the N-logic unit 150. When $EN_N(m)$ is high, the local oscillator signals for the N-Mixer 114 are enabled. These signals may be buffered by properly sized clock drivers 152 that finally drive the N-Mixer 114. If $EN_N(m)$ is low, the local oscillator signals for the N-Mixer 114 are disabled. Thus, there are no local oscillator signals in the N-Mixer clock drivers 152, and no power is consumed by the N-Mixer clock drivers 152.

Similarly, the P-logic unit 154 may create $LO_{P1}(m)$ by executing the logic operation $NAND(AND(LO_{I+}, VCO_-), EN_P(m))$, and may create $LO_{P3}(m)$ by executing the logic operation $NAND(AND(LO_{I-}, VCO_-), EN_P(m))$. When $EN_P(m)$ is high, the local oscillator signals for the P-Mixer 116 are enabled. These signals may be buffered by properly sized clock drivers 156 that finally drive the P-Mixer 116. If $EN_P(m)$ is low, the local oscillator signals for the P-Mixer 116 are disabled. As a result, there areno local oscillator signals in the P-Mixer clock drivers 156, and no power is consumed by the P-Mixer clock drivers 156.

The enable signals $EN_N(m)$ and $EN_P(m)$ are also input to multiplexers 134, $MUX_N(m)$ and $MUX_P(m)$, respectively. Multiplexers 134 use $EN_N$ and $EN_P$ to separately bias the transistor gates of the N-mixer 114 and P-mixer 116, respectively, to separately enable/disable the N-mixer 114 and P-mixer 116. For example, when $EN_N(m)$ is high, $MUX_N(m)$ 134 selects the input voltage $BIAS_N$ as the output. If $EN_N(m)$ is low, $MUX_N(m)$ selects the ground as the output. Similarly, when $EN_P(m)$ is high, $MUX_P(m)$ selects the input voltage $BIAS_P$ as the output. If $EN_P(m)$ is low, $MUX_P(m)$ selects a high potential as the output. As a result, each enabled mixer core 112 may work properly, and each disabled mixer core 112 will be floating and will not influence the operation of the enable mixer core(s) 112.

When individually calibrating using the narrow secondary mixer cores 112 (FIG. 8), the clock generator 130 shown in FIG. 7 may be modified to double the number of N-logic units 150, N-mixer clock drivers 152, P-logic units 154, P-mixer clock drivers 156, multiplexers 134, capacitors, and resistors. For this embodiment, the control signals $EN_N(m)$, $EN_P(m)$, and the clock generator output signals $LO_N(m)$, $LO_P(m)$ are labeled separately as $EN_{Nk}(m)$, $EN_{Pk}(m)$ for k={1,2,3,4} and $LO_{Nj}(m)$, $LO_{Pj}(m)$ for j={1,2,3,4}, respectively. The narrow secondary mixer cores of FIG. 8 should be adapted so that all transistor gate nodes are separated. For example, the gates for P1 and P4, and N1 and N4 may be disconnected and driven by the corresponding clock signals $LO_{Pj}(m)$ and $LO_{Nj}(m)$. This enables each transistor gate in the secondary mixer cores 112 to be separately enabled/disabled.

Figure 9:
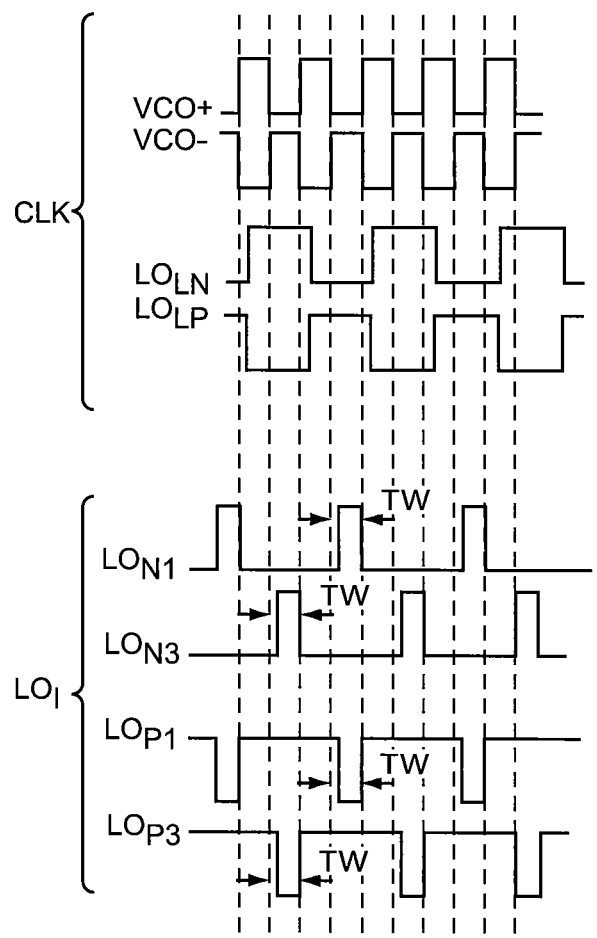
FIG. 9 shows a pulse diagram for exemplary pulses applied to and generated by the clock generator of FIG. 6.

FIG. 9 shows the duty cycle and phases of exemplary signals input to and generated by the clock generator 130. For four-phase clock signals in a ZIF receiver 10, the pulse width $T_w$ should be less than $0.25\,T_p$. $T_p$ represents the clock period at the receiver radio frequency. $T_w$ represents the conducting duty cycle which is the conducting time divided by the corresponding clock period. If the local oscillator clock signals become pulses with a certain rise and fall time, $T_w$ may be tuned by adjusting $BIAS_N$ and/or $BIAS_P$.

It will be appreciated that the present invention is not limited to the complementary mixer core 112 described above. In alternate embodiments, one or more mixer cores 112 may comprise only the N-mixer 114 or only the P-mixer 116 in each of the I-channel and Q-channel mixers 110, 120. For the N-mixer solution, the local oscillator drive unit 132 does not use $EN_P$, and the PMOS-specific circuits drawn inside the dashed box of FIGS. 5, 6 and/or 7 may be removed. Alternatively, for the P-mixer solution, the local oscillator drive unit 132 does not use $EN_N$, and the NMOS-specific circuits of FIGS. 5, 6 and/or 7 may be removed. It will be appreciated that the N-mixer solution is more common than the P-mixer solution as the P-mixer 116 consumes at least two times the power used by the N-mixer 114.

Figure 10:
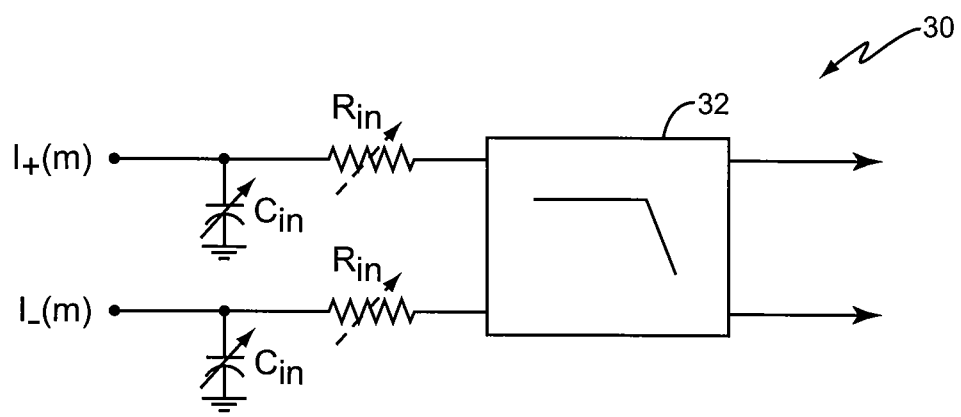
FIG. 10 shows a variable low pass filter for one exemplary embodiment.

The controller 140 of the present invention may also adjust the cut-off frequency $f_c$ of the filters 30 to maintain $f_c$ at a desired value. As the equivalent transistor width of all enabled transistors in the re-configurable mixer 100 changes, the mixer output impedance $R_{mo}$ also changes. $R_{mo}$ increases as the equivalent transistor width decreases, and vice verse. Normally, the filter 30 at the output of the passive mixer 100 comprises a passive, first order, low pass filter built with capacitors $C_{in}$ and input resistors $R_{in}$, and other filter components 32. The equivalent circuit for the filter 30 shows that $R_{mo}$ is parallel to $R_{in}$. Thus, when $R_{mo}$ changes, the cut-off frequency $f_c$ of filter 30 also changes. When $R_{in} \square R_{mo}$, the changes in $R_{mo}$ will have little impact on $f_c$. However, if $R_{in}$ is on the same order as $R_{mo}$, changes in $R_{mo}$ will also impact $f_c$. FIG. 10 shows a circuit diagram for a variable filter 30 that may be used when the accuracy of $f_c$ is important. For this filter, $C_{in}$ is variable. Thus, changes to the effective transistor width of the I-channel mixer 110 or the Q-channel mixer 120 may be compensated for by tuning $C_{in}$ of the corresponding filter 30 so that $f_c$ will remain constant. Alternatively or additionally, $R_{in}$ may optionally comprise a variable resistor so that changing $R_{in}$ compensates for changes to the effective transistor width, and therefore, keeps $f_c$ constant.

The disclosed re-configurable passive mixer 100 has multiple advantages. First, the passive mixer 100 of the present invention may reduce power consumption when an operating communication standard, e.g., TDD, allows a lower linearity or lower gain. Thanks to the variable effective transistor size of the mixer 100, the average power consumption will always be lower than the power consumption of a mixer with a fixed width, since the linearity requirements are time varying. The passive mixer 100 described herein may also improve the linearity achievable for FDD standards because a large equivalent transistor width may be achieved. Further, the passive mixer 100 may reduce the power consumption associated with FDD standards when less conversion gain is required. This is especially true during standby times when there is no need to send an output signal.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A passive mixer for a wireless receiver, said passive mixer comprising:
    a plurality of passive mixer cores connected in parallel and coupled directly to radio frequency input signals;
    a clock generator comprising at least one local oscillator drive unit for each passive mixer core, wherein each local oscillator drive unit has a separate enable/disable signal; and
    a controller configured to selectively enable one or more of the passive mixer cores and disable the remaining passive mixer cores by controlling the enable/disable signal of each local oscillator drive unit and by controlling a transistor bias voltage of each passive mixer core to ensure that each mixer core does not conduct any current when disabled.

2. The passive mixer of claim 1 wherein each mixer core comprises a plurality of transistors, and wherein transistors associated with different mixer cores have different sizes.

3. The passive mixer of claim 1 wherein each passive mixer core comprises a complementary passive mixer core comprising an N-mixer of parallel connected cascaded NMOS transistors connected in parallel to a P-mixer of parallel connected cascaded PMOS transistors.

4. The passive mixer of claim 1 wherein each passive mixer core comprises an N-mixer of cascaded NMOS transistors connected in parallel.

5. The passive mixer of claim 1 wherein the controller is further configured to:
    identify an operating communication standard for the wireless receiver; and
    vary the effective transistor size of the passive mixer by separately configuring each of the passive mixer cores based on one or more receiver front end performance parameters as bound by performance requirements of the operating communication standard.

6. The passive mixer of claim 1 wherein the plurality of mixer cores connected in parallel comprise:
    a first set of mixer cores connected in parallel for an In-phase mixer; and
    a second set of mixer cores connected in parallel for a Quadrature mixer.

7. The passive mixer of claim 1 wherein the controller is further configured to tune a variable low-pass filter connected to an output of the passive mixer based on the effective transistor size of the passive mixer to maintain a desired filter cut-off frequency.

8. The passive mixer of claim 1 wherein the plurality of passive mixer cores comprises a primary mixer core and a secondary mixer core, wherein the secondary mixer core comprises a plurality of binary weighted narrow width transistors, and wherein the controller separately enables or disables each of the binary narrow width transistors.

9. The passive mixer of claim 3 wherein the controller separately configures each of the passive mixer cores by selectively enabling the P-mixer in one or more of the passive mixer cores, and by selectively disabling the P-mixer in the remaining mixer cores.

10. The passive mixer of claim 3 wherein the effective transistor size of the enabled P-mixer differs from the effective transistor size of the enabled N-mixer to change a balance ratio between the N-mixer and P-mixer in one or more of the passive mixer cores.

11. The passive mixer of claim 5 wherein the performance parameters comprise at least one of a linearity, power consumption, and conversion gain.

12. A method for controlling a passive mixer in a wireless receiver, wherein the passive mixer comprises a plurality of passive mixer cores connected in parallel and coupled directly to radio frequency input signals, said method comprising:
    driving each passive mixer core with a separate local oscillator drive unit, wherein each local oscillator drive unit has a separate enable/disable signal; and
    separately configuring each of the passive mixer cores to selectively enable one or more of the passive mixer cores and disable the remaining passive mixer cores by controlling the separate enable/disable signal for each local oscillator drive unit and controlling a transistor bias voltage of each mixer core to ensure that each mixer core does not conduct any current when disabled.

13. The method of claim 12 wherein each mixer core comprises a plurality of transistors, and wherein the transistors associated with different mixer cores have different sizes.

14. The method of claim 12 wherein each passive mixer core comprises a complementary passive mixer core comprising an N-mixer of parallel connected cascaded NMOS transistors connected in parallel to a P-mixer of parallel connected cascaded PMOS transistors.

15. The method of claim 12 wherein the plurality of passive mixer cores of the passive mixer comprises an N-mixer of cascaded NMOS transistors connected in parallel.

16. The method of claim 12 further comprising:
    identifying an operating communication standard for the wireless receiver; and
    varying the effective transistor size of the passive mixer by separately configuring each of the passive mixer cores based on one or more receiver front end performance parameters as bound by performance requirements of the driving communication standard.

17. The method of claim 12 further comprising tuning a variable low-pass filter connected to an output of the passive mixer based on the effective transistor size of the passive mixer to maintain a desired filter cut-off frequency.

18. The method of claim 14 wherein separately configuring each of the passive mixer cores comprises selectively enabling the P-mixer in one or more of the passive mixer cores, and selectively disabling the P-mixer in the remaining mixer cores.

19. The method of claim 14 wherein the effective transistor size of the enabled P-mixer differs from the effective transistor size of the enabled N-mixer to change a balance ratio between the N-mixer and P-mixer in one or more of the passive mixer cores.

20. The method of claim 16 wherein the performance parameters comprise at least one of a linearity, power consumption, and conversion gain.

\* \* \* \* \*